(12) United States Patent
Erdogan et al.

(10) Patent No.: US 9,503,104 B2
(45) Date of Patent: Nov. 22, 2016

(54) LOW POWER LOSS OF LOCK DETECTOR

(71) Applicant: Texas Instruments Incorporated, Dallas, TX (US)

(72) Inventors: Mustafa Ulvi Erdogan, Allen, TX (US); Sridhar Ramaswamy, Plano, TX (US); Bhavesh G. Bhakta, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/735,757

(22) Filed: Jun. 10, 2015

(65) Prior Publication Data
US 2015/0365094 A1    Dec. 17, 2015

Related U.S. Application Data

(60) Provisional application No. 62/010,775, filed on Jun. 11, 2014.

(51) Int. Cl.
| | | |
|---|---|---|
| H03L 7/095 | (2006.01) | |
| H03L 7/089 | (2006.01) | |
| H03L 7/087 | (2006.01) | |
| H04L 7/04 | (2006.01) | |
| H03L 7/08 | (2006.01) | |
| H04L 7/033 | (2006.01) | |

(52) U.S. Cl.
CPC .............. *H03L 7/095* (2013.01); *H03L 7/087* (2013.01); *H03L 7/0807* (2013.01); *H03L 7/089* (2013.01); *H04L 7/04* (2013.01); *H04L 7/033* (2013.01)

(58) Field of Classification Search
CPC ......... H03L 7/095; H03L 7/04; H03L 7/087; H03L 7/089
See application file for complete search history.

(56) References Cited

U.S. PATENT DOCUMENTS

| | | | | | |
|---|---|---|---|---|---|
| 4,929,916 | A | * | 5/1990 | Fukuda | H03L 7/095 331/1 A |
| 5,822,387 | A | * | 10/1998 | Mar | H03L 3/00 375/374 |
| 5,920,239 | A | * | 7/1999 | Hardy | H03H 7/482 333/100 |
| 6,483,361 | B1 | * | 11/2002 | Chiu | H03L 7/0891 327/157 |
| 6,927,635 | B2 | * | 8/2005 | Miki | H03L 7/095 331/1 A |
| 8,258,831 | B1 | * | 9/2012 | Banai | H03L 7/095 327/147 |
| 8,736,323 | B2 | * | 5/2014 | Rhee | G01R 31/31709 327/147 |
| 2002/0118053 | A1 | * | 8/2002 | Sumi | H03L 7/087 327/157 |
| 2002/0140470 | A1 | * | 10/2002 | Aoki | H03L 7/0898 327/157 |
| 2003/0112915 | A1 | * | 6/2003 | Meltzer | H03L 7/0891 375/376 |
| 2005/0093598 | A1 | * | 5/2005 | Jeon | H03L 7/0812 327/158 |
| 2008/0042703 | A1 | * | 2/2008 | Sha | H03L 7/0812 327/158 |
| 2015/0128711 | A1 | * | 5/2015 | Ismail | G01H 1/00 73/652 |

\* cited by examiner

*Primary Examiner* — Jean B Corrielus
(74) *Attorney, Agent, or Firm* — Gregory J. Albin; Frank D. Cimino

(57) ABSTRACT

A loss of lock detector that includes a logic gate, a voltage-to-current converter coupled to the logic gate, a capacitor coupled to the converter, and a comparator coupled to the capacitor. The logic gate is configured to receive a first error signal and a second error signal from a phase detector, perform an AND function of the first and second error signals, and generate a gate output signal. The converter is configured to receive the gate output signal and generate a stream of current pulses representative of the gate output signal. The capacitor is configured to receive the stream of current pulses and generate a DC signal representative of the stream of current pulses. The comparator is configured to compare the DC signal to a reference signal and output a lock signal.

20 Claims, 4 Drawing Sheets

LOW POWER LOSS OF LOCK DETECTOR

CROSS-REFERENCE TO RELATED APPLICATIONS

The present application claims priority to U.S. Provisional Patent Application No. 62/010,775, filed Jun. 11, 2014, titled "Low Power Loss of Lock Detector," which is hereby incorporated herein by reference in its entirety.

BACKGROUND

In many communication systems, data is streamed from one device to another without an accompanying clock signal. During the transmission, the signals carrying the data streams may become jittery and difficult to decipher and process by the receiving device. Therefore, many systems utilize clock and data recovery circuits (CDR) to retime the incoming signals carrying the data streams and transmit the retimed signals to the receiving device. This requires the CDR to generate a clock that locks to the frequency of the streamed data. In many systems, the CDR detects the frequency of the incoming signals and phase aligns the clock signal to the incoming signals. The incoming signal is then retimed with a clean clock that has been generated by the CDR. The retimed signal then may be output to the receiving device for further processing.

SUMMARY

The problems noted above are solved in large part by systems and methods for determining whether a clock signal generated by a CDR is locked to an incoming data signal. In some embodiments, a loss of lock detector includes a logic gate, a voltage-to-current converter coupled to the logic gate, a capacitor coupled to the converter, and a comparator coupled to the capacitor. The logic gate is configured to receive a first error signal and a second error signal from a phase detector, perform an AND function of the first and second error signals, and generate a gate output signal. The converter is configured to receive the gate output signal and generate a stream of current pulses representative of the gate output signal. The capacitor is configured to receive the stream of current pulses and generate a DC signal representative of the stream of current pulses. The comparator is configured to compare the DC signal to a reference signal and output a lock signal.

Another illustrative embodiment is a clock and data recover circuit comprising a phase-frequency detector (PFD) circuit, a voltage-controlled oscillator (VCO) coupled to the PFD, and a loss of lock detector coupled to the PFD circuit. The PFD circuit is configured to lock a clock signal to a data signal and includes a frequency detector and a phase detector. The phase detector is configured to generate an UP error signal and a DOWN error signal. The VCO is configured to generate a VCO output signal that, after being divided, becomes the clock signal. The loss of lock detector is configured to perform an AND function on the UP and DOWN error signals to produce an AND gate output signal. The loss of lock detector also generates a lock signal that indicates that the clock signal is locked to the data signal based on a determination that the UP and DOWN error signals form a random pattern.

Yet another illustrative embodiment is a communication system comprising a transmitter, a clock and data recovery circuit coupled to the transmitter, and a receiver coupled to the clock and data recovery circuit. The clock and data recovery circuit is configured to receive a data signal from the transmitter and generate a clock signal from the data signal. The receiver is configured to receive an output signal from the clock and data recovery circuit. The clock and data recovery circuit includes a phase-frequency detector (PFD) circuit and a loss of lock detector. The loss of lock detector includes a logic gate, a voltage-to-current converter, a capacitor, and a comparator. The logic gate is configured to perform an AND function on a first and a second error signal received from the PFD to produce a gate output signal. The comparator is configured to generate a lock signal that indicates that the clock signal is locked to the data signal based on a determination that the first and second error signals form a random pattern.

Another illustrative embodiment is a method. The method may comprise generating UP and DOWN signals. The method also comprises generating an AND gate output signal by performing an AND function on the UP and DOWN signals. The method also comprises generating a stream of pulses representative of the AND gate output signal. The method also comprises generating a DC signal representative of the stream of current pulses. The method also comprises comparing a voltage of the DC signal to a voltage of a reference signal. The method also comprises, based on the voltage of the DC signal being greater than the voltage of the reference signal, generating a lock signal indicating that a clock signal and a data signal are locked.

BRIEF DESCRIPTION OF THE DRAWINGS

For a detailed description of various examples, reference will now be made to the accompanying drawings in which.

NOTATION AND NOMENCLATURE

Figure 1:
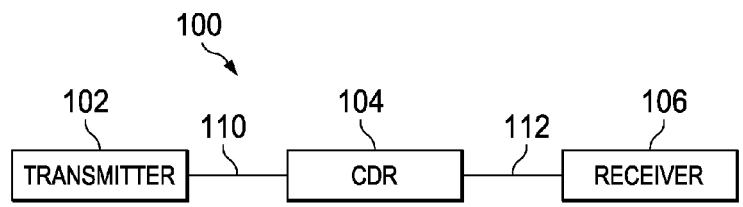
FIG. 1 shows a block diagram of a communication system in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Communication systems may be utilized to transfer data from a transmitting device to a receiving device for further processing. One type of communication system is a fiber optic system. A fiber optic system transmits data through the transmission of pulses of light through an optical fiber. Due to the optics in the optical fiber and noise from semiconductor devices, the data signals may incur jitter (i.e., instantaneous deviation from the original periodicity of the data signal sent by the transmitter which may be observed in the signal amplitude, phase, or frequency of the signal). This jitter may decrease, or in some cases prevent entirely, the receiving device's capability to process the data signal. Clock and data recovery circuits (CDRs) may be utilized in these communication systems to retime the data signal, so that the receiving device may receive a correctly timed, jitter-free signal. Because the data signal is transmitted without an accompanying clock, the CDR detects the frequency and/or phase of the data signal in order to create a clock that is locked to the frequency and phase of the data signal. This allows for a retimed signal to be provided to the receiving device.

The conventional CDR may utilize a rotational frequency detector (sometimes termed a "Pottbacker" detector) or a unilateral lock detector to determine when the clock locks to the frequency of the incoming data signal. However, the rotational frequency detector may lock the clock to an incorrect frequency. Furthermore, the rotational frequency detector may not be able to determine that a clock has lost lock once lock has previously been acquired. Unilateral lock detectors are only capable of locking the clock to the frequency of the incoming data signal from one direction. For example, a unilateral lock detector cannot lock the clock frequency to the incoming data frequency if the clock frequency begins at a point exceeding the target lock frequency if it is designed to lock the frequency from a point below the target lock frequency. Similarly, a unilateral lock detector cannot lock the clock frequency to the incoming data frequency if the clock frequency begins at a point below the target lock frequency if it is designed to lock the frequency from a point exceeding the target lock frequency. Furthermore, a unilateral lock detector cannot drive the clock frequency back to the target lock frequency once the clock frequency overshoots (i.e., exceeds the target lock frequency). The embodiments described herein pertain to a CDR that is able to quickly and accurately lock the clock to the incoming data signal, make a determination that the clock is locked, and make a determination when there is a loss of lock between the clock and the data signal while reducing space, power, and costly components.

FIG. 1 shows a block diagram of a communication system 100 in accordance with various embodiments. Communication system 100 may include transmitter 102, clock and data recovery circuit (CDR) 104, and receiver 106. Communication system 100 may be any type of communication system, including a fiber optic communication system. Transmitter 102 is any device that may transmit signals, including signals carrying data. The signals transmitted by transmitter 102 may be generated by transmitter 102 or they may be received by transmitter 102 from another device and retransmitted to the receiver 106. In an embodiment, the signals transmitted by transmitter 102 are fiber optic signals and may include telephone signals, internet communication, and/or cable television signals. In alternative embodiments, the signals transmitted by transmitter 102 may include any other type of electrical or optical signal. In some embodiments, transmitter 102 may include a light-emitting diode (LED) or a laser diode.

CDR 104 is coupled to transmitter 102 through a communication link and is configured to receive the signal transmitted by transmitter 102, shown as data signal 110. The communication link may be a fiber optic or electrically conductive cable or any other type of communication link that allows communication of an electrical or optical signal from transmitter 102 to CDR 104. While data signal 110 may be any waveform, in some embodiments, it is a square wave and may be an optical signal. Additionally, data signal 110 may be a differential pair of signals. In other words, data signal 110 may include a pair of the same signal, except that the two signals are 180 degrees out of phase with each other. CDR 104 may be an electrical circuit configured to generate a clock signal from data signal 110. In some embodiments, data signal 110 does not contain an accompanying clock signal. Therefore, CDR 104 generates a clock signal from an approximate frequency reference and phase aligns to the transitions in data signal 110.

CDR 104 may generate an output signal 112 that has a phase and frequency related to the phase and frequency of the data signal 110. Thus, the data within data signal 110 may be transmitted within the output signal 112 of CDR 104. In other words, CDR 104 is configured to sample data signal 110 and regenerate it with the CDR 104 generated clean clock signal. Thus, CDR 104 retimes data signal 110 by replicating data signal 110 under a clean clock domain and outputs a signal 112 with a related phase and frequency that regenerates the same data. This may eliminate jitter that data signal 110 may have developed while being carried in the communication link.

Receiver 106 is coupled to CDR 104 through a communication link that carries output signal 112. Receiver 106 is configured to receive output signal 112 from CDR 104. The communication link may be a fiber optic or electrically conductive cable or any other type of communication link that allows communication of output signal 112 to receiver 106. While output signal 112 may be any waveform, in some embodiments, it is a square wave and may be an optical signal. Because output signal 112 may be an optical signal, in an embodiment, receiver 106 is configured to receive fiber optic signals and may include a photodetector. Receiver 106 then may process the data contained in the output signal 112 for further use. In some embodiments, the CDR 104 is separate from, but coupled to, the receiver 106. In other embodiments, the CDR 104 is a circuit that is included as part of the receiver 106.

Figure 2:
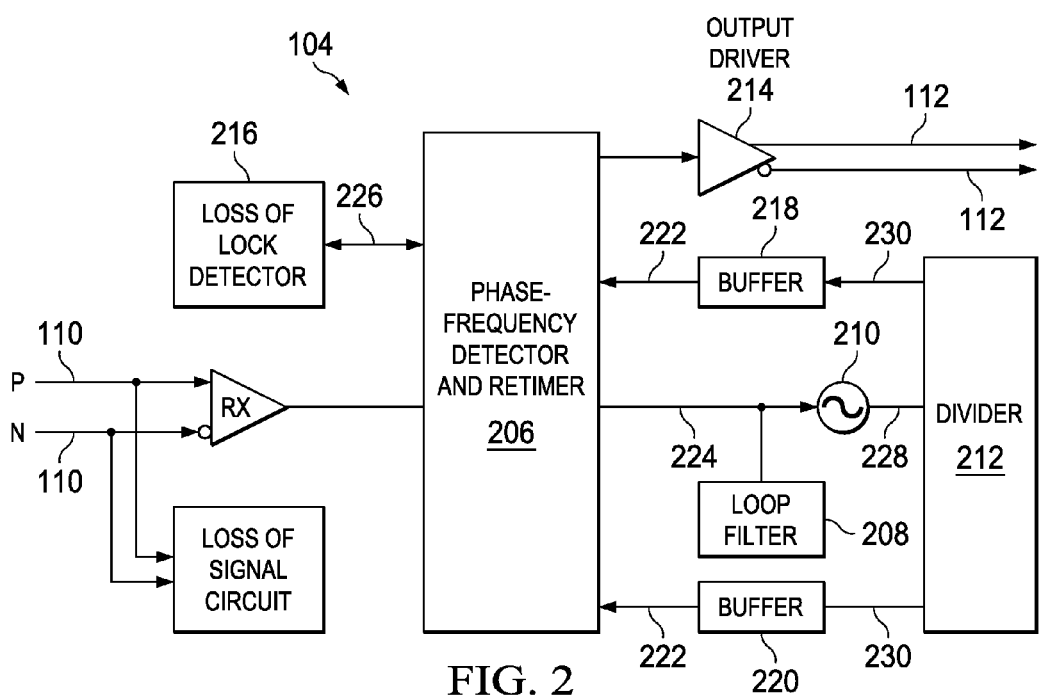
FIG. 2 shows a block diagram of a clock and data recovery circuit (CDR) in accordance with various embodiments.

FIG. 2 shows a circuit diagram of CDR 104 in accordance with various embodiments. CDR 104 may include a receiver 202, a loss of signal circuit (LOS) 204, a phase-frequency detector (PFD) 206, a loop filter 208, a voltage-controlled oscillator (VCO) 210, a divider 212, buffers 218 and 220, an output driver 214, and a loss of lock (LOL) detector 216. Receiver 202 is configured to receive data signal 110. While receiver 202 is depicted as a p-n photodiode in FIG. 2 receiving data signal 110 as a differential signal, receiver 202 may be any type of receiver and in some embodiments, any photodetector including a p-i-n photodiode, an avalanche photodiode, or a metal-semiconductor-metal photodetector that is capable of receiving optical signals. LOS 204 is a circuit that is configured to determine whether data signal 110 is present for signal processing by CDR 104.

PFD 206 is configured to determine the frequency of the data signal 110 (i.e., the frequency of the data stream received by receiver 202). PFD 206 may also be configured to determine the phase in which to align the clock signal 222 of CDR 104. In other words, because the data signal 110 may be in the form of a square wave, the PFD 206 is configured to determine where to align the edges of the clock signal 222, which also may be in the form of a square wave, with respect to the edges of data signal 110. Additionally, PFD 206 may retime data signal 110 (i.e., PFD 206 may sample data signal 110 and regenerate it utilizing clock signal 222).

PFD 206 determines the difference in frequency and/or phase between data signal 110 and clock signal 222. If the signals are square waves, PFD 206 may determine this difference by comparing the rising edge of the data signal 110 square wave to the rising edge of the clock signal 222 square wave. PFD 206 then may produce error signals based on the amount of frequency and/or phase difference it has detected between data signal 110 and clock signal 222. The PFD 206 then may translate the error signals into proportional positive and negative charge packets in the form of combined charge pump output signal 224 which is then fed into loop filter 208. This may cause the voltage at the output of loop filter 208 to increase or decrease based on the amount of positive or negative charge that enters loop filter 208.

Loop filter 208 may be a low pass filter which may be used to convert combined charge pump output signal 224, which is in the form of a current, to voltage and also to create loop stability. Loop filter 208 may also be used to limit reference frequency energy (i.e., ripple) which may appear at the PFD 206 combined charge pump output signal 224. The filtered combined charge pump output signal 224 then may be provided to VCO 210 for tuning.

VCO 210 may be an electronic oscillator configured to control oscillation frequency by a voltage input. Thus, the frequency of oscillation created is varied by the applied voltage. Based on the voltages VCO 210 receives from loop filter 208, VCO 210 tunes, or changes, the frequency and/or phase of its output to better track, once it is divided, the data signal 110 and outputs a signal identified as VCO signal 228. Like data signal 110 and clock signal 222, VCO signal 228 may take any waveform, including a square wave and may be in the form of a differential signal.

Because, in some embodiments, VCO 210 produces VCO signal 228 at a higher frequency than data signal 110, divider 212 is used to divide down the VCO signal 228 and outputs divided VCO signal 230. In some embodiments, divider 212 divides VCO signal 228 by 2 to create two distinct loops carrying divided VCO signal 230 that are fed into PFD 206 after, in some embodiments, being buffered by buffers 218 and 220. In alternative embodiments, divider 212 divides VCO signal 228 by 4 to create 2 distinct loops carrying 2 different phases (i.e., a differential pair) of divided VCO signal 230 in each loop that are fed into PFD 206 after, in some embodiments, being buffered by buffers 219 and 220. Divider 212 may be a negative feedback D flip-flop. In other words, the negative output of divider 212 may act as an input for divider 212.

Because PFD 206 is physically separated from VCO 210, capacitance increases in the system. Therefore, in an embodiment, buffers 218 and 220 receive divided VCO signal 230 and may delay the transit of divided VCO signal 230 back to PFD 206. Once buffering is complete, buffers 218 and 220 may generate clock signal 222 to feed back into PFD 206. In other words, divided VCO signal 230 is clock signal 222 prior to buffering. In alternative embodiments, buffers 218 and 220 do not exist and the divided VCO signal 230 is clock signal 222.

LOL detector 216 is configured to determine whether the frequency of clock signal 222 is locked to the frequency of data signal 110 and/or if a locked clock signal 222 experiences a loss of lock with data signal 110. LOL detector 216 is coupled to PFD 206 and may send a lock signal 226 to PFD 206 that indicates that the clock signal 222 is locked to data signal 110 and/or that the clock signal 222 has lost lock or is not locked to data signal 110.

PFD 206 also provides a retimed, based on the locked clock signal 222, data signal 110 to output driver 214. Output driver 214 is any type of output driver that may transmit the retimed signal to receiver 106 for further processing as output signal 112. In some embodiments, output driver 214 is an optical output driver such as a electroabsorptive modulated laser (EML).

Figure 3:
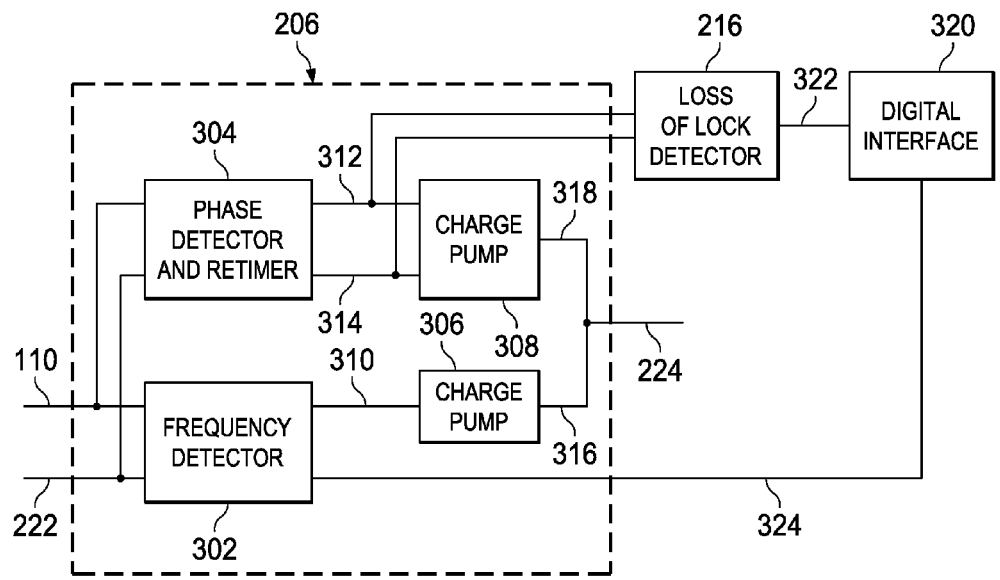
FIG. 3 shows a block diagram of a phase-frequency detector circuit (PFD) and its connections to a loss of lock (LOL) detector in accordance with various embodiments.

FIG. 3 shows a block diagram of PFD 206 and its connections to LOL detector 216 in accordance with various embodiments. PFD 206 may include frequency detector 302 connected to charge pump 306 and phase detector and retimer (PDR) 304 connected to charge pump 308. Frequency detector 302 may be configured to acquire the frequency of data signal 110. In some embodiments, frequency detector 302 is a binary phase detector. Frequency detector 302 receives data signal 110 and clock signal 222 and may compare the rising edge of the data signal 110 square wave to the rising edge of the clock signal 222 square wave and generate error signal 310 based on the comparison. Error signal 310 may be designated as an UP or DOWN signal or pulse.

An UP signal created by frequency detector 302 may be an indication that the frequency of data signal 110 is higher than the frequency of clock signal 222. A DOWN signal created by frequency detector 302 may be an indication that the frequency of input signal 110 is lower than the frequency of clock signal 222. Charge pump 306 may receive error signal 310 from frequency detector 302 and translate the error signal 310 into proportional positive and negative charge packets which is output as a charge pump output signal 316. If charge pump 306 receives an UP signal, this may indicate that the data signal 110 frequency is higher than the clock signal 222 frequency, and a positive charge may be created to tune VCO 210 to produce a higher frequency VCO signal 228. If charge pump 306 receives a DOWN signal, this may indicate that the data signal 110 frequency is lower than the clock signal 222 frequency, and a negative charge may be created to tune VCO 210 to produce a lower frequency VCO signal 228.

PDR 304 also receives data signal 110 and clock signal 222 as input. In some embodiments, PDR 304 is a ternary phase detector. PDR 304 may compare the rising edge of the input signal 110 square wave to the rising edge of the clock signal 222 square wave and generate error signals 312 and 314 based on the comparison. Error signal 312 may be designated as an UP signal or pulse while error signal 314 may be designated as a DOWN signal or pulse. An UP signal created by PDR 304 may be an indication that the frequency of data signal 110 is higher than the frequency of clock signal 222. A DOWN signal created by PDR 304 may be an indication that the frequency of data signal 110 is lower than the frequency of clock signal 222.

Charge pump 308 receives error signals 312 and/or 314 from PDR 304 and translates the error signals 312 and/or 314 into proportional positive and negative charge packets which is output as a charge pump output signal 318. If charge pump 308 receives an UP signal, this may indicate that the data signal 110 frequency is higher than the clock signal 222 frequency, and a positive charge may be created to tune VCO 210 to produce a higher frequency VCO signal 228. If charge pump 308 receives a DOWN signal, this may indicate that the input signal 110 frequency is lower than the clock signal 222 frequency, and a negative charge may be created to tune VCO 210 to produce a lower frequency VCO signal 228. Charge pump output signals 316 and 318 are combined to create combined charge pump output signal 224 to be fed into loop filter 208 and VCO 210. PDR 304 also may retime data signal 110 based on the phase and frequency of clock signal 222. Thus, PDR 304 may sample data signal 110 and regenerate it based on clock signal 222.

In addition to charge pump 208 receiving error signals 312 and/or 314, LOL detector 216 also receives UP error signal 312 and DOWN error signal 314 from PDR 304. LOL detector 216 is configured to generate lock signal 322 from the error signals 312 and/or 314. Lock signal 322 indicates either that clock signal 222 is locked to data signal 110 or that clock signal 222 is not locked to data signal 110. In an embodiment, a LOW (i.e., 0) lock signal 322 indicates that clock signal 222 is locked to data signal 110 while a HIGH (i.e., 1) lock signal 322 indicates that clock signal 222 is not locked to data signal 110. Digital interface 320 may receive lock signal 322 from LOL detector 322 and generate flag signal 324. Digital interface 320 may be any type of digital circuit that may generate flag signal 324 and in some embodiments may be a part of LOL detector 216. In some embodiments, flag signal 324 is a control signal received by frequency detector 302 that indicates whether clock signal 222 is locked to data signal 110 or not. In an embodiment, frequency detector 302 is disabled based on receiving flag signal 324 indicating that clock signal 222 is locked to data signal 110. Additionally, frequency detector 302 may be enabled, or remain enabled, based on receiving flag signal 324 indicating that clock signal 222 is not locked to data signal 110 or if clock signal has lost lock with data signal 110. In this way, LOL detector 216 in conjunction with digital interface 320 may control the enabling and disabling of frequency detector 302.

Figure 4:
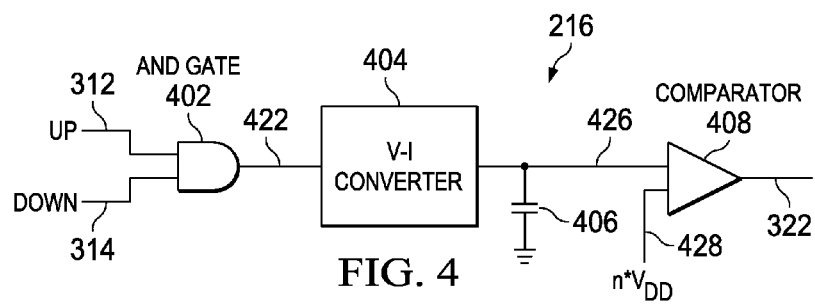
FIG. 4 shows a block diagram of a LOL detector in accordance with various embodiments.

FIG. 4 shows a block diagram of a LOL detector 216 in accordance with various embodiments. LOL detector 216 may include AND gate 402, voltage-to-current converter 404, capacitor 406, and comparator 408. AND gate 402 may be a digital logic gate and in some embodiments a current mode logic (CML) AND gate. AND gate 402 is configured to receive and perform an AND function on UP error signal 312 and DOWN error signal 314. Thus, AND gate 402 outputs a HIGH (i.e., 1) pulse, as AND gate output signal 422, if UP error signal 312 and DOWN error signal 314 are HIGH. However, if UP error signal 312 and/or DOWN error signal 314 is LOW (i.e., 0), then AND gate 402 outputs a LOW AND gate output signal 422.

When clock signal 222 is locked to data signal 110, phase detector 304 generates a random pattern of UP and DOWN error signals 312 and 314. This is due to the small step changes in the frequency of clock signal 222 around the lock frequency (i.e., the frequency of clock signal 222 drifts around the lock frequency). Thus, UP and DOWN error signals 312 and 314 will both output both HIGH and LOW signals at various times when clock signal 222 is locked to data signal 110. Therefore, when clock signal 222 is locked to data signal 110, there is a 25% chance that the result of the AND function performed on UP error signal 312 and DOWN error signal 314 will result in a HIGH AND gate output signal 422. This means that the AND gate output signal 422 will contain various HIGH pulse data points when there is a lock (i.e., usually approximately 25% of the time but at least some of the time). This pattern for error signals 312 and 314 may be termed a random pattern.

Conversely, when clock signal 222 is not locked to data signal 110, phase detector 304 does not generate a random pattern of UP and DOWN error signals 312 and 314. Instead, phase detector 304 will generate a series of HIGH UP error signals 312 at the same time as generating a series of LOW DOWN error signals 314 or a series of HIGH DOWN error signals 312 at the same time as generating a series of LOW UP error signals 314. This enables the CDR 104 to drive the frequency of clock signal 222 toward the lock frequency. Thus, when clock signal 222 is not locked to data signal 110, UP and DOWN error signals 312 and 314 do not both output HIGH and LOW signals at the same time. Instead, when UP error signal 312 is HIGH, DOWN error signal 314 is LOW and when DOWN error signal 314 is HIGH, UP error signal 312 is LOW. This pattern for error signals 312 and 314 may be termed a beat pattern. Therefore, when clock signal 222 is not locked to data signal 110, the result of the AND function performed on UP error signal 312 and DOWN error signal 314 will result in a continuous LOW AND gate output signal 422.

Because phase detector 304 generates UP and DOWN error signals 312 and 314 continuously, AND gate 402 also generates AND gate output signal 422 continuously. Thus, AND gate output signal 422 may be thought of as a continuous stream of data (i.e., a continuous stream of HIGH and/or LOW pulse signals). Converter 404 receives AND gate output signal 422 as a stream of HIGH and/or LOW pulse signals and converts the signal into a stream of current pulses representative of the HIGH and/or LOW pulse signals. Thus, converter 404 generates a stream of current pulses representative of the AND gate output signal 422. The stream of pulses is in the form of positive and negative current pulses. Thus, if at a specific data point, the AND gate output signal 422 generates a HIGH pulse signal, the converter 404 may generate a positive current pulse at the same data point. Similarly, if the at a specific data point, the AND gate output signal 422 generates a LOW pulse signal, the converter 404 may generate a negative current pulse at the same data point. Because converter 404 generates a stream of current pulses from the incoming voltage signals of AND gate output signal 422, in some embodiments, it is termed a charge pump and may be a bipolar switched current source.

Capacitor 406 receives the stream of current pulses and generates a direct current (DC) signal 426 representative of the stream of current pulses and thus, representative of the AND gate output signal 422. In other words, converter 404 generates the stream of current pulses from the AND gate output signal 422 and integrates the stream of current pulses on capacitor 406 to extract the DC signal representative of the AND gate output signal 422. Thus, if the AND gate output signal 422 is continuously LOW, the integrated value, and therefore, the extracted DC signal 426 will be continuously 0 volts. Thus, when clock signal 222 is not locked to data signal 110, the DC signal 426 will have a voltage close to 0. However, if the AND gate output signal 422 contains some HIGH pulses, after some time, capacitor 406 will generate an integrated DC signal 426 that has a voltage greater than 0 volts. Thus, when clock signal 222 is locked to data signal 110, the DC signal 426 will have a voltage greater than 0.

Comparator 408 receives DC signal 426 and a fraction of the power supply voltage ($n*V_{DD}$) which is shown in FIG. 4 as reference signal 428. Comparator 408 generates lock signal 322 based on the comparison. If the voltage of DC signal 422 is greater than reference signal 428 (and in some embodiments, not less than the voltage of reference signal 428), then comparator 408 generates lock signal 322 indicating that the clock signal 222 is locked to data signal 110. In some embodiments, lock signal 322 is a LOW pulse signal if lock signal 322 is indicating that the clock signal 222 is locked to data signal 110. However, if the voltage of DC signal 422 is not greater than reference signal 428 (and in some embodiments, less than the voltage of reference signal 428), then comparator 408 generates lock signal 322 indicating that the clock signal 222 is not locked to data signal 110. In some embodiments, lock signal 322 is a HIGH pulse signal if lock signal 322 is indicating that the clock signal 222 is not locked to data signal 110. Reference signal 428, in some embodiments, has a voltage half the voltage DC signal 426 is expected to be at if the clock signal 222 is locked to data signal 110. For example, if the expected value of the voltage of DC signal 426 is 300 mV if the clock signal 222 is locked to data signal 110, then the voltage of reference signal 428 may be set to 150 mV.

Figures 5A, 5B:
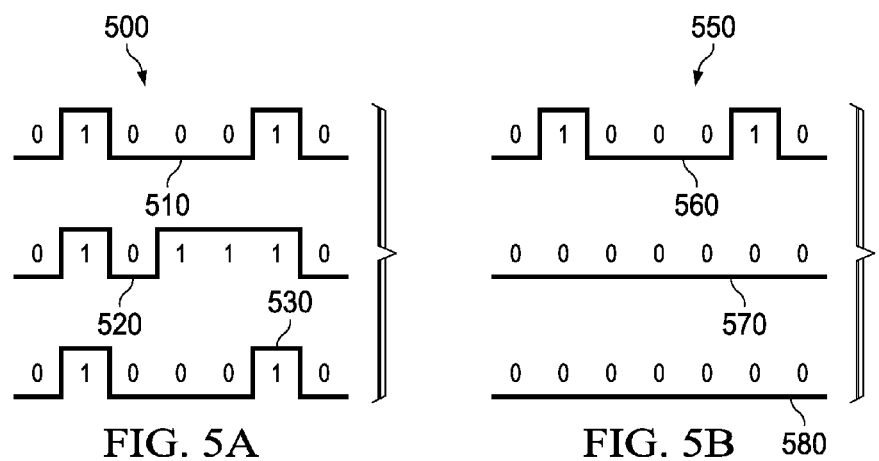
FIG. 5A shows an example stream of error signal data through an AND gate generating an AND gate output signal indicating that a clock signal is locked to a data signal in accordance with various embodiments.
FIG. 5B shows an example stream of error signal data through an AND gate generating an AND gate output signal indicating that a clock signal is not locked to a data signal in accordance with various embodiments.

FIG. 5A shows an example 500 stream of error signal data through AND gate 402 generating AND gate output signal 422 indicating that clock signal 222 is locked to data signal 110 in accordance with various embodiments. Example signal stream 510 represents data received from UP error signal 312 while example signal stream 520 represents data received from DOWN error signal 314. When both the UP error signal 312 and the DOWN error signal 314 are HIGH, then the example signal stream 530, representing AND gate output signal 422, is also HIGH. However, when either the UP error signal 312 or the DOWN error signal 314 are LOW, then the AND gate output signal 422 is also LOW. As discussed previously, because, in this example, the AND gate output signal 422 contains a random pattern of HIGH pulses, clock signal 222 is considered to be locked to data signal 110.

FIG. 5B shows an example 550 stream of error signal data through AND gate 402 generating an AND gate output signal 422 indicating that clock signal 222 is not locked to data signal 110 in accordance with various embodiments. Example signal stream 560 represents data received from UP error signal 312 while example signal stream 570 represents data received from DOWN error signal 314. When either the UP error signal 312 or the DOWN error signal 314 are LOW, then the example signal stream 580, representing AND gate output signal 422, is LOW. Because, in this example, example signal stream 570 contains all LOW pulses, example signal stream 580 also contains all LOW pulses. As discussed previously, because, in this example, the AND gate output signal 422 is continuously LOW, clock signal 222 is considered to not be locked to data signal 110.

Figure 6A:
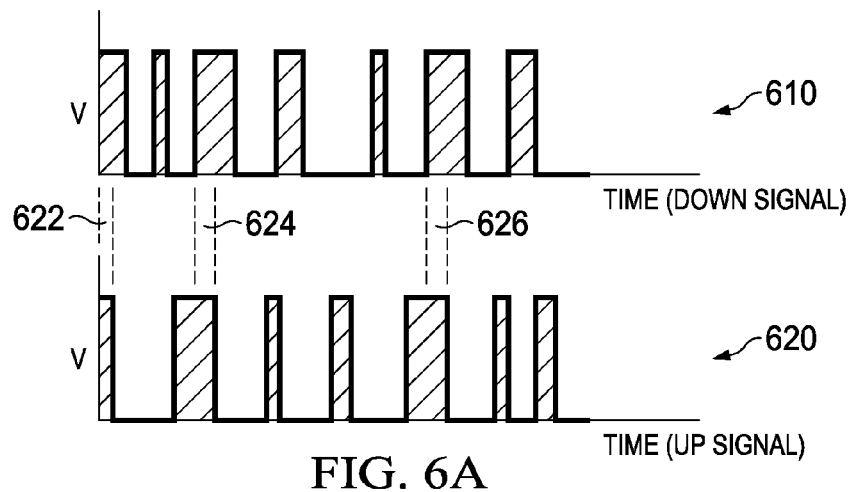
FIG. 6A shows example voltage versus time graphs of UP and DOWN signals that indicate that a clock signal is locked to a data signal in accordance with various embodiments.

FIG. 6A shows example voltage versus time graphs 610 and 620 of UP and DOWN error signals 312 and 314 that indicate that clock signal 222 is locked to data signal 110 in accordance with various embodiments. Graph 610 is a voltage versus time graph of an example DOWN signal 314. Graph 620 is a voltage versus time graph of an example UP signal 312. Because, in this example, clock signal 222 is locked to data signal 110, small step changes in the frequency of clock signal 222 around the lock frequency occur. Therefore, UP and DOWN error signals 312 and 314 will both output both HIGH and LOW pulses at various, what appear to be, random times. However, there are various periods of time 622,624, and 626 where both UP and DOWN error signal 312 and 314 both output a HIGH pulse. During these periods of time, AND gate 402 will generate AND gate output signal 422 as a HIGH pulse. This indicates that clock signal 222 is locked to data signal 110.

Figure 6B:
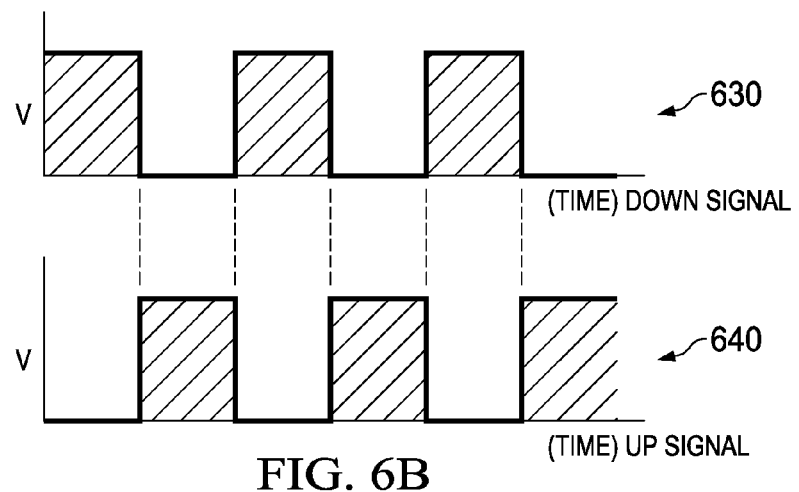
FIG. 6B shows example voltage versus time graphs of UP and DOWN signals that indicate that a clock signal is not locked to a data signal in accordance with various embodiments.

FIG. 6B shows example voltage versus time graphs 630 and 640 of UP and DOWN error signals 312 and 314 that indicate that clock signal 222 is not locked to data signal 110 in accordance with various embodiments. Graph 630 is a voltage versus time graph of an example DOWN signal 314. Graph 640 is a voltage versus time graph of an example UP signal 312. Because, in this example, clock signal 222 is not locked to data signal 110, CDR 104 drives the frequency of clock signal 222 toward the lock frequency. Therefore, only one of UP and DOWN error signals 312 and 314 will be a HIGH pulse at a time. In other words, when DOWN signal 314 is a HIGH pulse, UP signal 312 is a LOW pulse while when UP signal 312 is a HIGH pulse, DOWN signal 314 is a LOW pulse. This is an example of a beat pattern of pulses for UP signal 312 and DOWN signal 314. This indicates that clock signal 222 is not locked to data signal 110.

Figure 7:
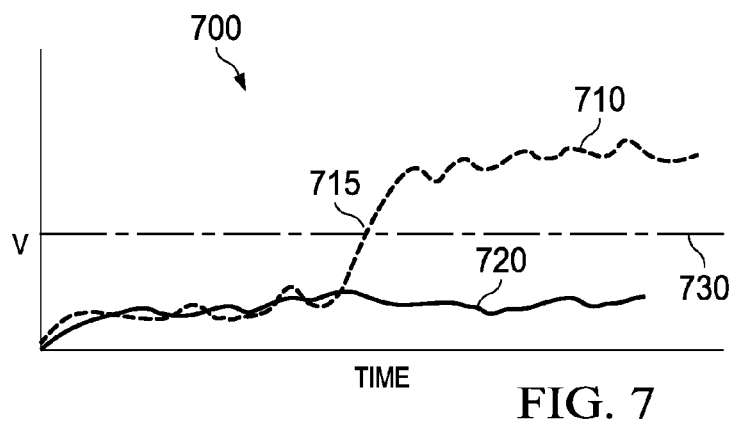
FIG. 7 shows an example voltage versus time graph illustrating an example DC signal that indicates a clock signal is locked to a data signal and an example DC signal that indicates that a clock signal is not locked to a data signal in accordance with various embodiments.

FIG. 7 shows an example voltage versus time graph 700 illustrating an example DC signal 426 that indicates clock signal 222 is locked to data signal 110 and an example DC signal 426 that indicates that clock signal 222 is not locked to data signal 110 in accordance with various embodiments. Curve 710 is an example plot of the voltage of DC signal 426 in which clock signal 222 becomes locked to data signal 110. Curve 720 is an example plot of the voltage of DC signal 426 when clock signal 222 is not locked to data signal 110. Curve 730 is an example plot of the voltage of reference signal 428. As discussed previously, comparator 408 compares the voltage of DC signal 426 with the voltage of reference signal 428 where the voltage of reference signal 426 represents the AND gate output signal 422.

Curve 710 illustrates a voltage for DC signal 426 that is less than the voltage of reference signal 730 for a first period of time. During this time period, clock signal 222 is not locked to data signal 110. However, at time 715, the voltage of DC signal 426, as shown in curve 710, begins to exceed the voltage of reference signal 428. Therefore, after time 715, clock signal 222 is locked to data signal 110. Hence, prior to time 715 comparator outputs lock signal 322 indicating that clock signal 222 is not locked to data signal 110; however, at time 715 and after, comparator outputs lock signal 322 indicating that clock signal 222 is locked to data signal 110. Curve 720 illustrates a voltage for DC signal 426 that is less than the voltage of reference signal 730 throughout the time period shown in graph 700. Therefore, clock signal 222 is never locked data signal 110 in the example shown by curve 720. Hence, comparator outputs lock signal 322 indicating that clock signal 222 is not locked to data signal during the entirety of the time shown in graph 700.

Figure 8:
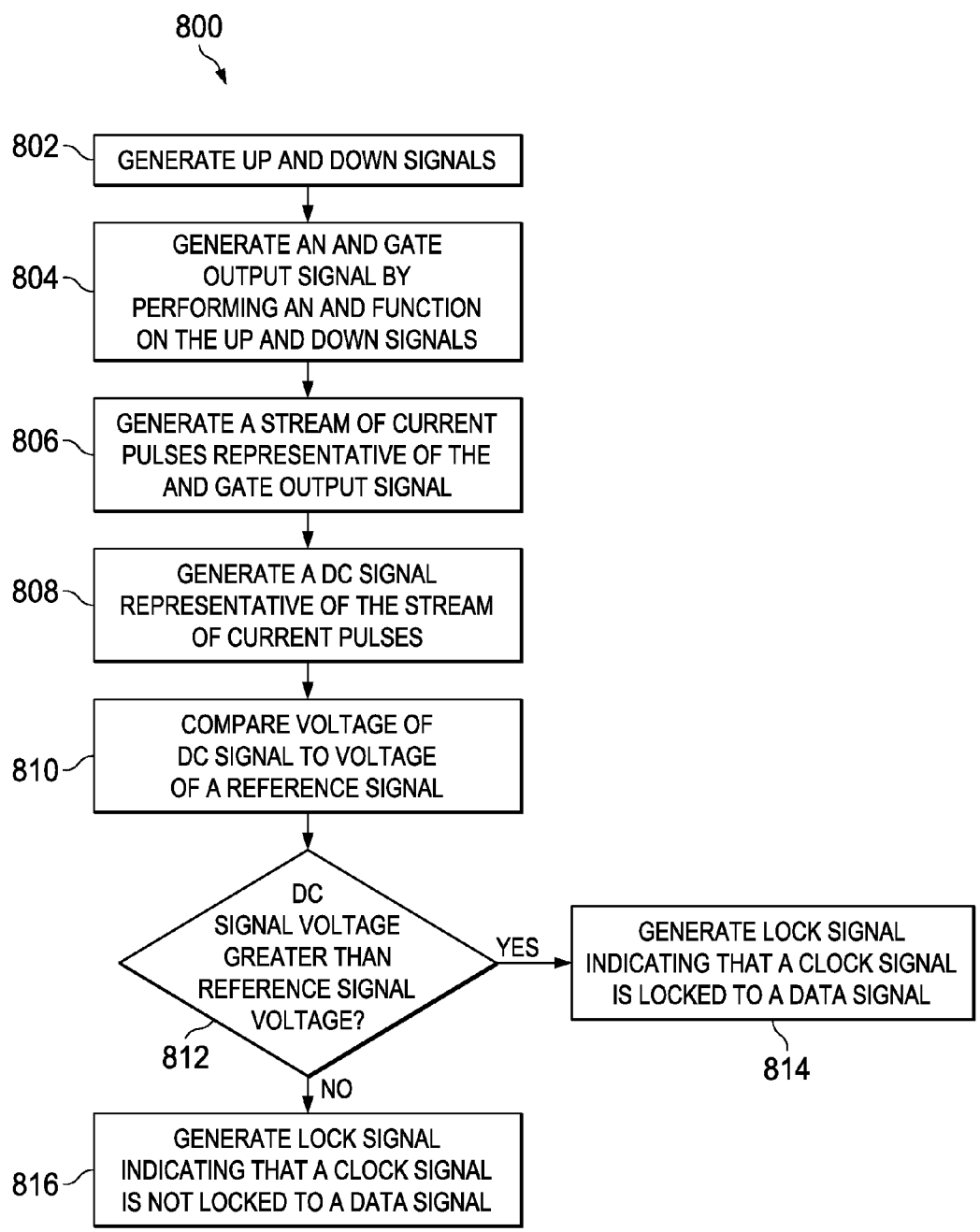
FIG. 8 shows a flow diagram of a method for determining whether a clock signal generated by a CDR is locked to an incoming data signal in accordance with various embodiments.

FIG. 8 shows a flow diagram of a method 800 for determining whether clock signal 222 generated by CDR 104 is locked to data signal 110 in accordance with various embodiments. Though depicted sequentially as a matter of convenience, at least some of the actions shown in method 800 can be performed in a different order and/or performed in parallel. Additionally, some embodiments may perform only some of the actions shown or may perform additional actions. In some embodiments, at least some of the operations of the method 800, as well as other operations described herein, can be performed by CDR 104 implemented by a processor executing instructions stored in a non-transitory computer readable storage medium or a state machine.

The method 800 begins in block 802 with generating, by phase detector 304, UP and DOWN error signals 312 and 314. In block 804, the method 800 continues with generating AND gate output signal 422 utilizing AND gate 402. AND gate 402 performs an AND function on the UP and DOWN error signals 312 and 314 to generate the AND gate output signal 422. The AND gate 402 may generate a HIGH pulse if both of the UP and DOWN error signals 312 and 314 are HIGH pulses during the same time period. However, if the UP or DOWN error signals 312 and 314 are LOW pulses during the same time period, then AND gate 402 may generate a LOW pulse.

In block 806, the method 800 continues with generating, utilizing voltage-to-current converter 404, a stream of current pulses representative of the AND gate output signal 422. The stream of current pulses may be positive and negative current pulses that represent whether the voltage contained in AND gate output signal 422 is HIGH or LOW. The method 800 continues in block 808 with generating DC signal 426 which is representative of the stream of current pulses generated by converter 404. In block 810, method 800 continues with comparing the voltage of DC signal 426 with the voltage of reference signal 428.

The method 800 continues in block 812 with determining, in some embodiments by comparator 408, whether the voltage of DC signal 426 is greater than the voltage of reference signal 428. If the determination in block 812 is that the voltage of DC signal 426 is greater than the voltage of reference signal 428, then, in block 814, the method 800 continues with generating, in some embodiments by comparator 408, lock signal 322 indicating that clock signal 222 is locked to data signal 110. In some embodiments, a LOW pulse from lock signal 322 indicates that clock signal 222 is locked to data signal 110. However, if the determination in block 812 is that the voltage of DC signal 426 is not greater than the voltage of reference signal 428, then, in block 816, the method 800 continues, with generating, in some embodiments by comparator 408, lock signal 322 indicating that clock signal 222 is not locked to data signal 110. In some embodiments, a HIGH pulse from lock signal 322 indicates that clock signal 222 is not locked to data signal 110.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A loss of lock detector, comprising:
   a logic gate configured to receive a first error signal and a second error signal from a phase detector, perform an AND function on the first and second error signals, and generate a gate output signal;
   a voltage-to-current converter coupled to the logic gate, the converter configured to receive the gate output signal and generate a stream of current pulses representative of the gate output signal;
   a capacitor coupled to the converter, the capacitor configured to receive the stream of current pulses and generate a direct current (DC) signal representative of the stream of current pulses; and
   a comparator coupled to the capacitor, the comparator configured to compare the DC signal to a reference signal and output a lock signal.

2. The loss of lock detector of claim 1, wherein, based on a voltage of the DC signal being greater than a voltage of the reference signal, the lock signal indicates that a clock signal and a data signal through the phase detector are locked.

3. The loss of lock detector of claim 1, wherein, based on a voltage of the DC signal being less than a voltage of the reference signal, the lock signal output indicates that a clock signal and a data signal through the phase detector are not locked.

4. The loss of lock detector of claim 1, wherein a voltage of the reference signal is a fraction of a power supply voltage.

5. The loss of lock detector of claim 1, wherein a voltage of the reference signal is half an expected voltage of the DC signal based on a clock signal and a data signal through the phase detector being locked.

6. The loss of lock detector of claim 1, wherein the logic gate is a current mode logic AND gate.

7. The loss of lock detector of claim 1, wherein the first error signal is an UP signal and the second error signal is a DOWN signal and based on receiving a HIGH UP signal and a HIGH DOWN signal from the phase detector, the logic gate is configured to generate a HIGH pulse as the gate output signal and based on receiving a LOW UP signal or a LOW DOWN signal, the logic gate is configured to generate a LOW signal as the gate output signal.

8. The loss of lock detector of claim 1, wherein the DC signal is an integral of the stream of current pulses.

9. A clock and data recovery (CDR) circuit, comprising:
   a phase-frequency detector (PFD) circuit configured to lock a clock signal to a data signal, the PFD circuit including a frequency detector and a phase detector, the phase detector configured to generate an UP error signal and a DOWN error signal;
   a voltage-controlled oscillator (VCO) coupled to the PFD, the VCO configured to generate a VCO output signal that, after being divided, becomes the clock signal; and
   a loss of lock detector coupled to the PFD circuit, the loss of lock detector configured to perform an AND function on the UP and DOWN error signals to produce an AND gate output signal and generate a lock signal that indicates that the clock signal is locked to the data signal based on a determination that the UP and DOWN error signals form a random pattern.

10. The CDR circuit of claim 9, wherein the loss of lock detector is further configured to generate a lock signal that indicates that the clock signal is not locked to the data signal based on a determination that the UP and DOWN error signals form a beat pattern.

11. The CDR circuit of claim 9, further comprising a digital interface coupled to the loss of lock detector, the digital interface configured to receive the lock signal and generate flag signal indicating that the clock signal is locked to the data signal.

12. The CDR circuit of claim 11, wherein the frequency detector is configured to receive the flag signal.

13. The CDR circuit of claim 12, wherein the frequency detector is disabled based on the flag signal indicating that the clock signal is locked to the data signal.

14. The CDR circuit of claim 13, wherein the frequency detector is enabled based on the flag signal indicating that the clock signal is not locked to the data signal.

15. The CDR circuit of claim 9, wherein the loss of lock detector is further configured to generate a stream of current pulses representative of the AND gate output signal.

16. The CDR circuit of claim 15, wherein the loss of lock detector is further configured to generate a direct current (DC) signal representative of the stream of current pulses and compare the DC signal to a reference signal.

17. The CDR circuit of claim 16, wherein the determination that the UP and DOWN error signals form a random pattern is based on a voltage of the DC signal being greater than a voltage of the reference signal.

18. A communication system, comprising:
a transmitter;
a clock and data recovery (CDR) circuit coupled to the transmitter, the CDR circuit configured to receive a data signal from the transmitter, generate a clock signal from the data signal, and generate an output signal; and
a receiver coupled to the CDR circuit, the receiver configured to receive the output signal,
wherein the CDR circuit includes a phase-frequency detector (PFD) circuit and a loss of lock detector that includes a logic gate, a voltage-to-current converter coupled to the logic gate, a capacitor coupled to the voltage-to-current converter, and a comparator, the logic gate configured to perform an AND function on a first and a second error signal received from the PFD to produce a gate output signal and the comparator configured to generate a lock signal that indicates that the clock signal is locked to the data signal based on a determination that the first and second error signals form a random pattern.

19. The communication system of claim 18, wherein the converter is configured to receive the gate output signal and generate a stream of current pulses representative of the gate output signal, the capacitor is configured to receive the stream of current pulses and generate a direct current (DC) signal representative of the stream of current pulses, and the comparator is configured to receive the DC signal, compare the DC signal to a reference signal, and output a lock signal based on a voltage of the DC signal being greater than a voltage of the reference signal.

20. A method comprising:
generating UP and DOWN signals;
generating an AND gate output signal by performing an AND function on the UP and DOWN signals;
generating a stream of current pulses representative of the AND gate output signal;
generating a direct current (DC) signal representative of the stream of current pulses;
comparing a voltage of the DC signal to a voltage of a reference signal; and
based on the voltage of the DC signal being greater than the voltage of the reference signal, generating a lock signal indicating that a clock signal and a data signal are locked.

* * * * *